United States Patent
Sasaki et al.

(10) Patent No.: US 7,086,175 B2
(45) Date of Patent: Aug. 8, 2006

(54) METHOD OF MANUFACTURING LIQUID CRYSTAL PANEL AND GAP ADJUSTING APPARATUS THEREFOR

(75) Inventors: Naoki Sasaki, Tokyo (JP); Hideki Yoshizawa, Tokyo (JP)

(73) Assignee: ANELVA Corporation, Tokyo (JP)

( * ) Notice: Subject to any disclaimer, the term of this patent is extended or adjusted under 35 U.S.C. 154(b) by 110 days.

(21) Appl. No.: 10/960,112

(22) Filed: Oct. 8, 2004

(65) Prior Publication Data
US 2005/0086825 A1 Apr. 28, 2005

(30) Foreign Application Priority Data
Oct. 10, 2003 (JP) ............................. 2003-351660

(51) Int. Cl.
*F26B 13/30* (2006.01)
(52) U.S. Cl. .......................................... 34/92; 349/187
(58) Field of Classification Search ................ 34/92, 34/201, 218; 349/187, 153
See application file for complete search history.

(56) References Cited

U.S. PATENT DOCUMENTS

| | | | | |
|---|---|---|---|---|
| 6,005,653 A | * | 12/1999 | Matsuzawa | 349/154 |
| 6,798,488 B1 | * | 9/2004 | Murata et al. | 349/187 |
| 6,824,023 B1 | * | 11/2004 | Kim et al. | 222/504 |
| 6,922,229 B1 | * | 7/2005 | Yawata et al. | 349/187 |
| 6,959,502 B1 | * | 11/2005 | Nakamura et al. | 34/233 |
| 2001/0026347 A1 | * | 10/2001 | Sawasaki et al. | 349/156 |
| 2006/0048896 A1 | * | 3/2006 | Muramoto et al. | 156/381 |

FOREIGN PATENT DOCUMENTS

| JP | 3-78724 A | 4/1991 |
|---|---|---|
| JP | 6-88951 A | 3/1994 |
| JP | 7-20480 A | 1/1995 |
| JP | 7-318949 A | 12/1995 |
| JP | 10026763 | * 1/1998 |
| JP | 2000-347197 A | 12/2000 |

* cited by examiner

*Primary Examiner*—S. Gravini
(74) *Attorney, Agent, or Firm*—Sughrue Mion, PLLC (57) ABSTRACT

In a method of manufacturing a liquid crystal panel including a panel assembly, a nozzle mechanism is located at a vicinity of a liquid crystal filling port of the panel assembly with leaving a space between an intake of the nozzle mechanism and the liquid crystal filling port. The nozzle mechanism sucks surrounding gaseous to generate negative pressure and a continuous gaseous flow around the liquid crystal filling port. The negative pressure discharges an excess of liquid crystal filled in the panel assembly while the continuous gaseous flow blows the discharged liquid crystal. The blown liquid crystal is sucked into the intake of the panel assembly. Thus, a gap of the panel assembly is adjusted within a proper range in a short time.

16 Claims, 6 Drawing Sheets

METHOD OF MANUFACTURING LIQUID CRYSTAL PANEL AND GAP ADJUSTING APPARATUS THEREFOR

This application claims priority to prior Japanese patent application JP 2003-351660, the disclosure of which is incorporated herein by reference.

BACKGROUND OF THE INVENTION

This invention relates to a method of manufacturing a liquid crystal panel and a gap adjusting apparatus therefor.

In general, a panel assembly (or cell) is used for manufacturing a liquid crystal panel. The panel assembly includes a pair of substrates located in opposition to each other with leaving a gap to define an internal space which is filled with liquid crystal. When an excess of the liquid crystal is filled into the internal space of the panel assembly, a gap between the substrates is expanded. Therefore, it is necessary to prevent the excess of the liquid crystal from being filled into the internal space or to discharge the excess of the liquid crystal from the internal space. These can be made by adjusting the gap within a proper range.

A first related method of manufacturing a liquid crystal panel uses pressing plates to press both faces of the panel assembly when or after the liquid crystal is filled into the internal space thereof. According to the method, the excess of the liquid crystal is prevented from being filled into the internal space or discharged from the internal space. Consequently, sealing a filling port of the panel assembly keeps the gap within the proper range after the pressing plates are taken away. Such a method is disclosed in Japanese Patent Application Publication (JP-A) No. H6-88951.

A second related method of manufacturing a liquid crystal panel uses a pressure difference between inside and outside of the panel assembly. According to the method, the excess of the liquid crystal is discharged from the internal space and thereby the gap is adjusted within the proper range. Such a method is disclosed in Japanese Patent Application Publication (JP-A) No. H7-20480 or No. 2000-347197.

A third related method of manufacturing a liquid crystal panel uses a vacuum packing bag and atmospheric pressure. When the vacuum packing bag is evacuated, the panel assembly placed therein is pressed by atmospheric pressure. As a result, the excess of the liquid crystal is discharged from the internal space and thereby the gap is adjusted within the proper range. Such a method is disclosed in Japanese Patent Application Publication (JP-A) No. H3-78724.

A fourth related method of manufacturing a liquid crystal panel uses a vacuum pump to draw the excess of the liquid crystal from the panel assembly. Such a method is disclosed in Japanese Patent Application Publication (JP-A) No. H7-318949.

These methods mentioned above have a common problem. That is, the excess of the liquid crystal discharged from the panel assembly adheres to an edge of the panel assembly around the filling port. The liquid crystal on the edge of the panel assembly must be wiped. This reduces manufacturing efficiency.

SUMMARY OF THE INVENTION

It is therefore an object of this invention to provide a method of manufacturing a liquid crystal panel capable of adjusting efficiently a gap of a panel assembly by the use of a simple adjusting apparatus.

Other object of this invention will become clear as the description proceeds.

According to a first aspect of this invention, a method of manufacturing a liquid crystal panel including a panel assembly comprises the steps of filling a gap of the panel assembly with liquid crystal through a liquid crystal filling port of the panel assembly, placing an intake member in a vicinity of the liquid crystal filling port of the panel assembly with leaving a space between the intake member and the liquid crystal filling port, sucking through the intake member to generate negative pressure and a continuous gaseous flow around the liquid crystal filling port, and adjusting the gap by means of the negative pressure and the continuous gaseous flow.

The method may have the step of controlling the continuous gaseous flow by means of a gaseous flow control member.

Furthermore, the method may have the step of increasing temperature of the panel assembly.

Still furthermore, the method may have the step of pressing the panel assembly from both faces thereof with pressurized gas.

According to a second aspect of this invention, a gap adjusting apparatus is for use in manufacturing a liquid crystal panel including a panel assembly. The gap adjusting apparatus comprises an intake nozzle for sucking to produce negative pressure and continuous gaseous flow around a vicinity of a liquid crystal filling port of the panel assembly. A gaseous flow control member is formed on the intake nozzle to control the continuous gaseous flow.

DESCRIPTION OF THE PREFERRED EMBODIMENTS

Figure 1A:
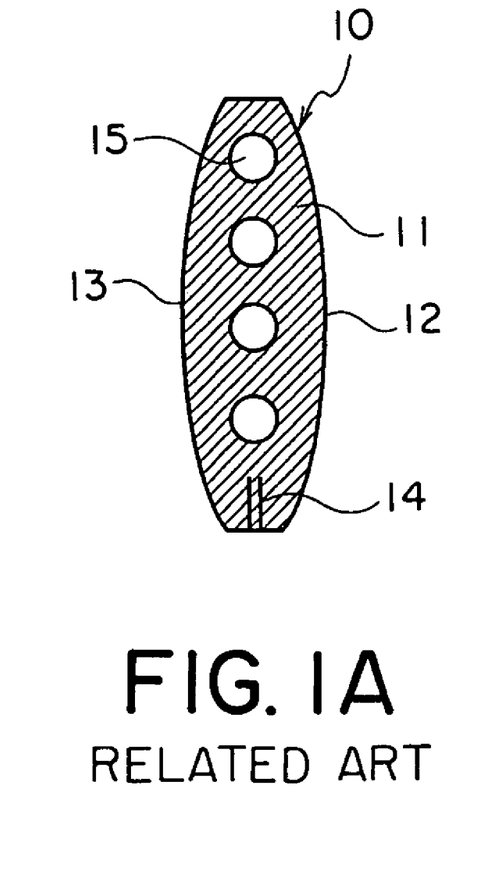
FIGS. 1A to 1C are schematic sectional views for describing a first related method of manufacturing a liquid crystal panel.
Figures 1B, 1C:
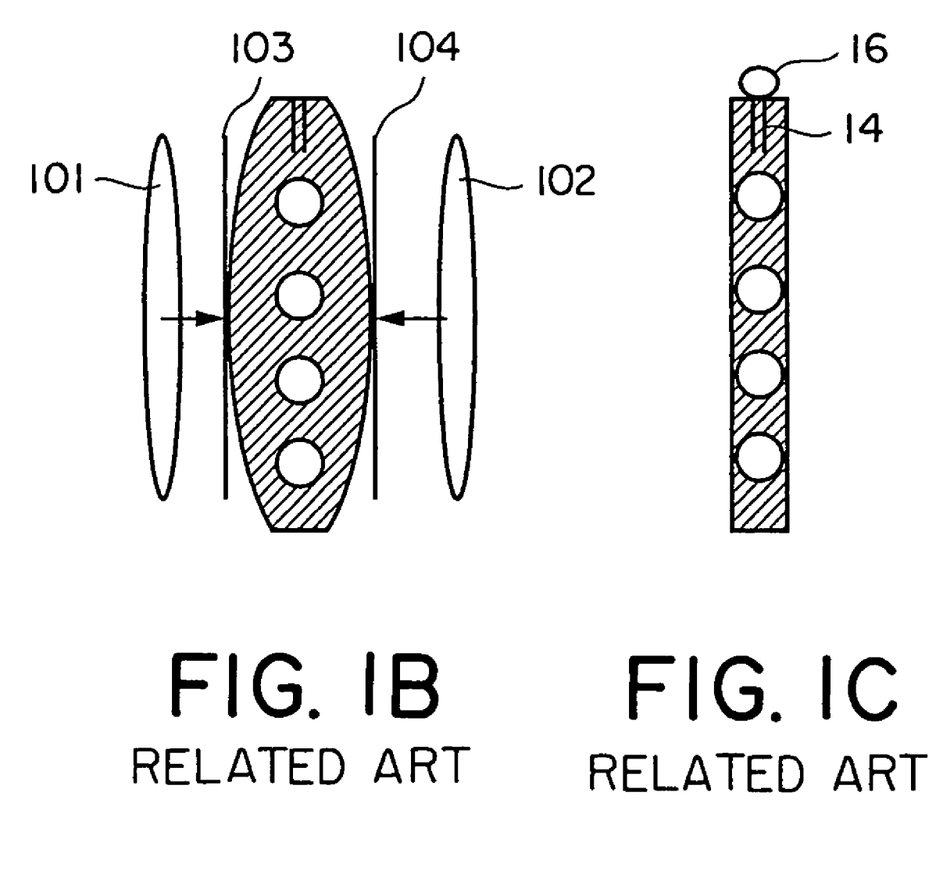

Referring to FIGS. 1A to 1C, description will be at first directed to a first related method of manufacturing a liquid crystal panel for a better understanding of this invention.

In brief, the first related method uses a pair of pressing plates. A panel assembly is located between the pressing plates and pressed from both faces thereof when or after liquid crystal is filled into an internal space thereof. The pressing plates limit a thickness of the panel assembly to adjust a gap between substrates of the panel assembly and thereby an excess of the liquid crystal is prevented from being filled into the internal space or discharged from the internal space.

In detail, FIG. 1A shows a schematic sectional view of a panel assembly 10 filled with liquid crystal 11. The panel assembly 10 includes a pair of substrates 12 and 13 which are located in opposition to each other with leaving a gap. The substrates 12 and 13 are sealed at their peripheries except an inlet portion to define an internal space for the liquid crystal 11. Though it is desirable that the gap between the substrates 12 and 13 has a value within a prescribed range, the gap is partly expanded by the liquid crystal 11 filled into the internal space. A liquid crystal filling port 14 is provided at the inlet portion to pass the liquid crystal. A lot of spacers 15 depicted by circles are provided in the internal space to prevent the substrates 12 and 13 from coming close to each other undesirably.

As illustrated in FIG. 1B, the panel assembly 10 having the expanded gap is placed between pressing plates 101 and 102 of a pressing mechanism (not shown). At this time, spacer sheets 103 and 104, such as rubber plates, are located on exposed surfaces of the substrates 12 and 13 to protect the exposed surfaces against damage caused by the pressing plates 101 and 102. Subsequently, the pressing plates 101 and 102 press the substrates 12 and 13 so that the gap is adjusted within the prescribed range. Consequently, an excess of the liquid crystal 11 is discharged from the internal space to the outside of the panel assembly through the liquid crystal filling port 14. At this time, the spacers 15 keep the minimum gap between the substrates.

After that, the liquid crystal filling port 14 is sealed with a sealant 16 as illustrated in FIG. 1C before the gap is expanded again by influence of gravitation on the liquid crystal 11. Thus, the liquid crystal panel having the gap adjusted within the prescribed range is obtained.

The filling of the liquid crystal 11 may be executed simultaneously with the pressing by the use of the pressing plates. In this case, the excess of the liquid crystal is prevented from being filled into the internal space of the panel assembly.

As mentioned above, the method can adjust the gap of the panel assembly within the prescribed range. However, the method has a problem that the liquid crystal discharged from the panel assembly adheres to an edge of the liquid crystal filling port. Thus, the method needs a process to wipe the discharged liquid crystal before the sealing process.

Figure 2A:
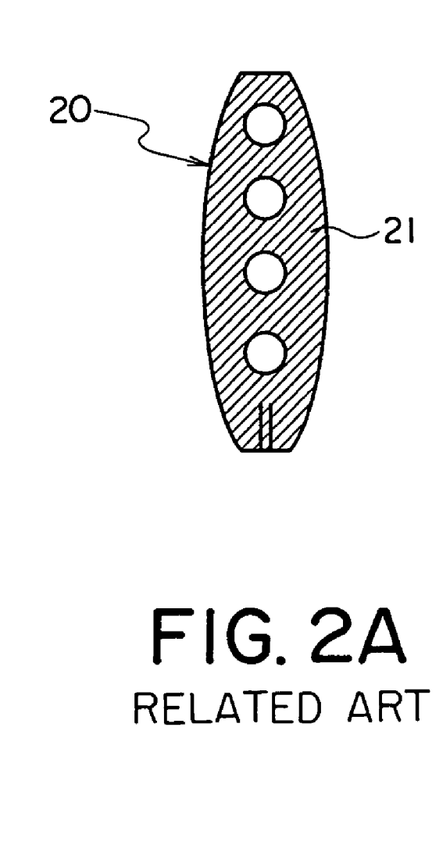
FIGS. 2A to 2C are schematic sectional views for describing a second related method of manufacturing a liquid crystal panel.
Figure 2B:
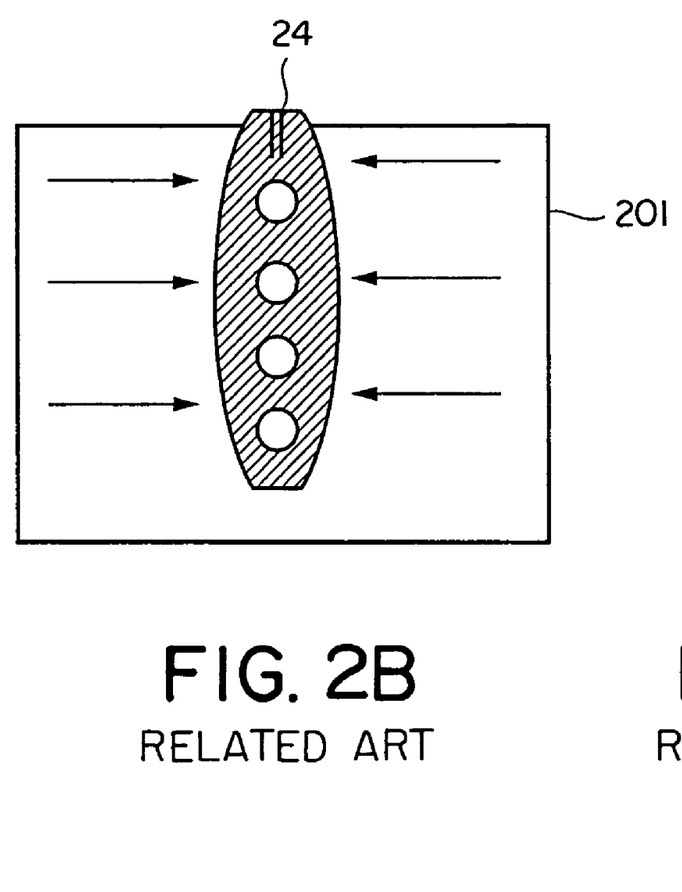
Figure 2C:
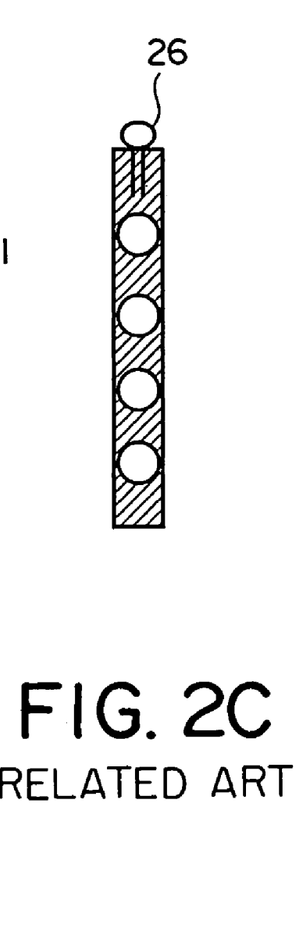

Referring to FIGS. 2A to 2C, a second related method of manufacturing a liquid crystal panel will be described soon.

In brief, the method uses pressurized gas. A panel assembly is placed in a compressing chamber except a liquid crystal filling port and vicinity. The pressurized gas presses the panel assembly in the compressing chamber and a gap of the panel assembly is adjusted within a prescribed range by a pressure difference between the inside and the outside of the panel assembly.

In detail, as illustrated in FIG. 2A, a panel assembly 20 is similar to that of FIG. 1. That is, the panel assembly 20 has a gap expanded by the liquid crystal 21.

As illustrated in FIG. 2B, the panel assembly 20 is put in a compressing chamber 201 except a liquid crystal filling port 24 and vicinity. Then the panel assembly 20 receives pressure of pressurized gas introduced in the compressing chamber 201. Because the liquid crystal filling port 24 is out of the compressing chamber 201, pressure difference is produced between the inside and the outside of the panel assembly. Consequently, an excess of the liquid crystal is discharged from the panel assembly by the pressure difference and thereby the gap of the panel assembly is adjusted within the prescribed range.

After that, the liquid crystal filling port 24 is sealed with a sealant 26 as illustrated in FIG. 2C. Thus, the liquid crystal panel having the gap adjusted within the prescribed range is obtained.

However, the method also has a problem that it is necessary to wipe the discharged liquid crystal which adheres the edge of the liquid crystal filling port 24.

A third related method of manufacturing a liquid crystal panel uses a vacuum packing bag to admit a panel assembly like that of FIG. 1A or 2A. When the vacuum packing bag is evacuated, the panel assembly housed in the vacuum packing bag is pressed by atmospheric pressure and liquid crystal filled into the panel assembly is drawn to the outside of the panel assembly. As a result, a gap of the panel assembly is adjusted within the prescribed range.

However, this method is inefficient because the panel assembly is put into the vacuum packing bag one at a time and the vacuum packing bag is evacuated. Furthermore, when an excess of liquid crystal is discharged from the panel assembly, it is not discharged from the vacuum packing bag.

A fourth related method of manufacturing a liquid crystal panel uses a vacuum pump securely coupled to a liquid crystal filling port by the use of an O ring and a flat plate. The vacuum pump draws an excess of liquid crystal from a panel assembly like that of FIG. 1A or 2A. As a result, a gap of the panel assembly is adjusted within the prescribed range.

However, the method is inefficient because the vacuum pump is securely coupled to the panel assembly with airtight piping. In addition, the excess of the liquid crystal drawn out from the panel assembly stays at a vicinity of an outer opening of a liquid crystal filling port of the panel assembly and it is difficult to be removed. This is due to the airtight piping and viscosity of the liquid crystal.

Referring to FIGS. 3 to 7, the description will proceed to a method of manufacturing a liquid crystal panel according to a first embodiment of this invention.

At first, a liquid crystal filling process of the method is described with reference to FIGS. 3A to 3C.

Figure 3A:
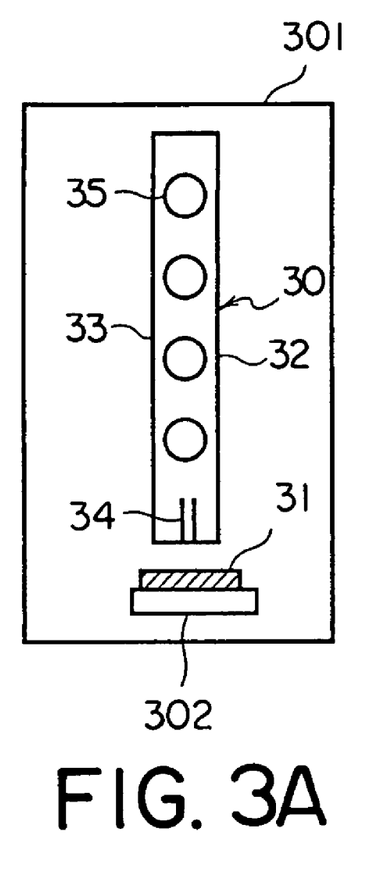
FIGS. 3A to 3C are schematic diagrams for describing a liquid crystal filling process of a method of manufacturing a liquid crystal panel according to a first preferred embodiment of this invention.
Figure 3B:
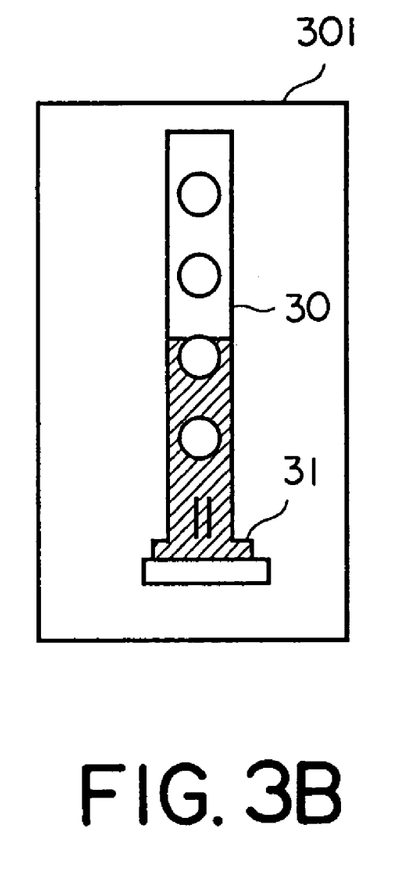
Figure 3C:
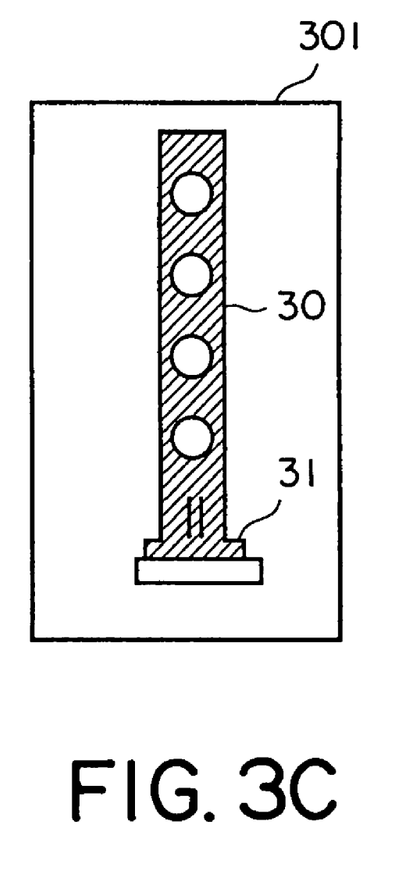

Firstly, as illustrated in FIG. 3A, a panel assembly 30 is introduced into a vacuum chamber 301 together with a liquid crystal tray 302 filled with liquid crystal 31. Here, the panel assembly 30 includes a pair of substrates (e.g. glass substrates) 32 and 33 having rectangular shape. The substrates 32 and 33 are located in opposite to each other to leave a gap and sealed at their peripheries except a liquid crystal filling port 34. The substrates 32 and 33 define an internal space of the panel assembly 30 while a lot of spacers 35 are provided in the internal space to keep the gap to a prescribed value or more.

Secondarily, internal pressure of the vacuum chamber 301 is decreased. In other words, the vacuum chamber is evacuated. At this time, internal pressure of the panel assembly 30 is decreased through the liquid crystal filling port 34 with the decrease of the internal pressure of the vacuum chamber 301. In addition, gas bubbles are removed from the liquid crystal 31.

Thirdly, a part of the panel assembly 30 is touched to the liquid crystal 31 on the liquid crystal tray 302 so that the liquid crystal 31 obstructs an outer opening of the liquid crystal filling port 34.

Lastly, the internal pressure of the vacuum chamber 301 is gradually returned to atmospheric pressure in the state that the liquid crystal filling port 34 is obstructed by the liquid crystal 31 on the liquid crystal tray 302. As a result, the liquid crystal 31 on the tray 302 flows gradually into the panel assembly 30 through the liquid crystal filling port 34 as illustrated in FIGS. 3B and 3C. The flow of the liquid crystal is caused by difference between the internal pressure of the panel assembly 30 and that of the vacuum chamber 301 and by a capillary phenomenon of the gap between the substrates 32 and 33.

Here, the gap of the panel assembly 30 has a larger value than the objective value (or a proper value) in general. In other words, the gap is partly expanded even before the liquid crystal 31 is filled in the internal space. Furthermore, when the panel assembly has a small size (e.g. 1 to 5 inches), needed volume of the liquid crystal 31 tends to be filled into the internal space of the panel assembly 30 before the internal pressure of the vacuum chamber 301 returns to the atmospheric pressure. Accordingly, an excess of the liquid crystal 31 is filled into the panel assembly 30 when the internal pressure of the vacuum chamber 301 returns to the atmospheric pressure. In this case, the excess of the liquid crystal 31 filled into the panel assembly 30 expands the gap of the panel assembly 30.

Additionally, when the panel assembly has a large size (e.g. 10 inches or more), insufficient volume of the liquid crystal 31 tends to be filled into the internal space of the panel assembly 30 even when the internal pressure of the vacuum chamber 301 returns to the atmospheric pressure. Accordingly, in this case, it is necessary to continue to fill the liquid crystal into the panel assembly after the internal pressure of the vacuum chamber 301 returns to the atmospheric pressure. Therefore, the gap can be controlled to an unexpanded state by controlling the continuous time of filling of the liquid crystal when the panel assembly has the large size.

Though a sealing process is executed after the liquid crystal filling process, it is necessary to adjust the expanded gap within the proper range and to discharge the excess of the liquid crystal from the panel assembly before the sealing process. To adjust the gap of the panel assembly, a gap adjusting apparatus having a nozzle mechanism as illustrated in FIGS. 4A and 4B is used.

Figure 4A:
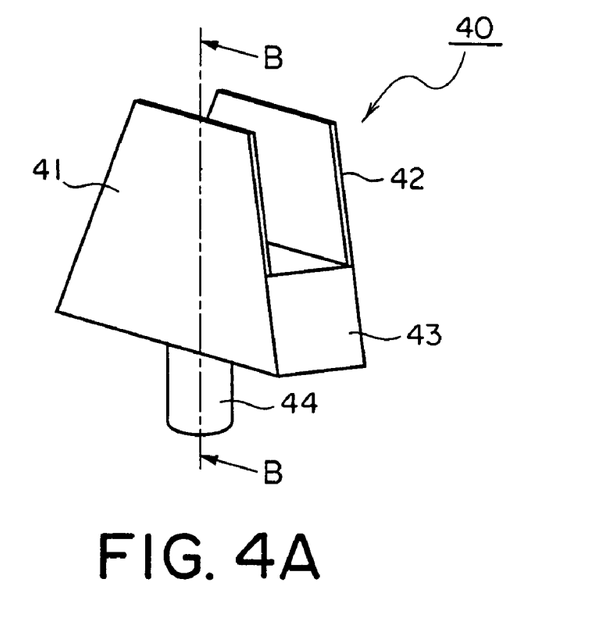
FIG. 4A is an oblique perspective view of a nozzle mechanism used in a gap adjusting process of the method of manufacturing the liquid crystal panel according to the first embodiment of this invention.
Figure 4B:
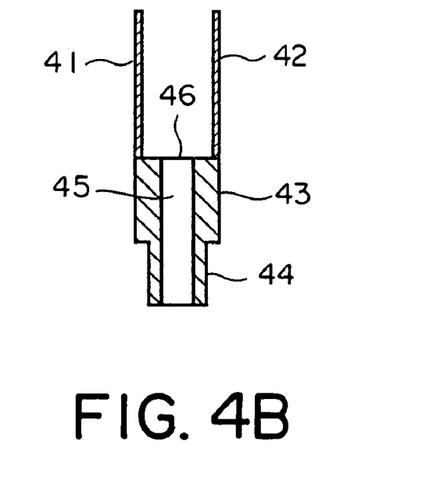
FIG. 4B shows a vertical section of the nozzle mechanism of FIG. 4A.

As shown in FIGS. 4A and 4B, the nozzle mechanism 40 includes a pair of nozzle plates 41 and 42, a base 43 and an exhaust pipe 44.

The nozzle plates 41 and 42 are located in opposite to each other at a predetermined interval and fixed to the base 43. The nozzle plates 41 and 42 may be formed on the top of the base 43. Alternatively, the nozzle plates 41 and 42 may be formed with the base 43 as one body. The predetermined interval is decided to be larger than thickness of the panel assembly having the expanded gap. The nozzle plates 41 and 42 have flexibility and elasticity (or resilience). The nozzle plates 41 and 42 are made of a material not to damage surfaces of the substrates 32 and 33. For instance, the material of the nozzle plates 41 and 42 is a (synthetic) resin or a (synthetic) rubber or the like. Alternatively, the nozzle plates 41 and 42 may be thin metal plates coated by resin or rubber.

The base 43 provides a through hole 45 which leads to the exhaust pipe 44. The base 43 serves as an intake nozzle (or member). An opening (or an intake) 46 of the through hole 45 is exposed to a space between the nozzle plates 41 and 42.

The exhaust pipe 44 is coupled to an air displacement pump or a vacuum pump (not shown) via another exhaust pipe (not shown).

A gap adjusting process (or a sucking process) is executed by using the nozzle mechanism 40 as follows. Here, the liquid crystal filling process and the gap adjusting process can successively be executed on condition that the nozzle mechanism 40 is provided in the vacuum chamber for the liquid crystal filling process.

Figure 5A:
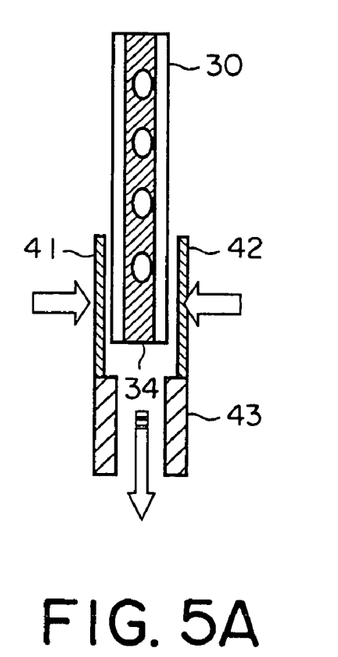
FIGS. 5A to 5C are schematic sectional views for describing the gap adjusting process.

First, the panel assembly 30 filled with the liquid crystal is put under atmospheric pressure (e.g. in the atmosphere). Then, as illustrated in FIG. 5A, the nozzle mechanism 40 is moved close to a vicinity of the liquid crystal filling port 34. This is realized by lowering the panel assembly 30 or lifting the nozzle mechanism 40 after the panel assembly 30 is transferred to above the nozzle mechanism 40.

In FIG. 5A, the nozzle plates 41 and 42 are placed at a distance from surfaces of the panel assembly 30 at both sides of a part (i.e. the vicinity of the liquid crystal filling port 34) corresponding to the liquid crystal filling port 34. The base 43 is placed at a prescribed distance from an edge surface (at a lower side in FIG. 5A), at which the liquid crystal filling port 34 is provided, of the panel assembly 30. Additionally, it is desirable that the opening 46 of the base 43 correctly faces the liquid crystal filling port 34.

Next, suction (or decrease in pressure) is executed from between the nozzle plates 41 and 42. This is different from decrease in internal pressure of the vacuum chamber or from production of a vacuum in the vacuum chamber. The suction is performed through from the opening 46 to the exhaust pipe 44. The suction makes lower (or negative) pressure between the nozzle plates 41 and 42 than surrounding pressure (e.g. the atmospheric pressure) and gaseous (e.g. air) flows flowing into the opening 46. To continue producing the gaseous flows, gas may be supplied from the outside if necessary. For instance, the vacuum chamber may be opened outside when the nozzle mechanism 40 is provided in the vacuum chamber.

Figure 5B:
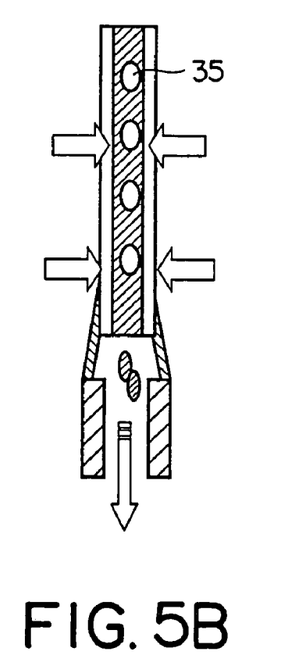

The nozzle plates 41 and 42 serve as gaseous flow control members to control the gaseous flows caused by the suction through the opening 46. That is, the nozzle plates 41 and 42 prevent gaseous flows flowing from the front and the rear (or right and left sides of FIG. 5A) of the panel assembly 30 to the opening 46 from being generated. The nozzle plates 41 and 42 control the gaseous flows to flow mainly in a longitudinal direction (perpendicular to a sheet of FIG. 5A) of the edge of the panel assembly 30. Here, the nozzle plates 41 and 42 are bent by pressure difference (or the negative pressure) to come close to each other. As a result, the nozzle plates 41 and 42 closely come in contact with both faces of the panel assembly 30 as illustrated in FIG. 5B. Thus, the nozzle pates 41 and 42 further limit the gaseous flows in direction and increase velocity of the gaseous flows flowing into the opening 46. The gaseous flows are roughly illustrated in FIG. 6.

The negative pressure generated at the vicinity of the outer opening of the liquid crystal filling port 34 reduces the internal pressure of the panel assembly 30. In addition, the panel assembly 30 receives the atmospheric pressure at both faces. Consequently, the panel assembly 30 has a pressure difference between the inside and the outside. Thus, the substrates 32 and 33 receive force inward and thereby a part of the liquid crystal 31 filled into the panel assembly 30 is pressed out. At this time, the distance between the substrates 32 and 33 is kept to a predetermined minimum value or more because the spacers 35 are provided in the panel assembly 30. Accordingly, the suction process discharges only the excess of the liquid crystal 31 from the panel assembly 30 and limits the gap of the panel assembly 30 within the proper range.

Figure 6:
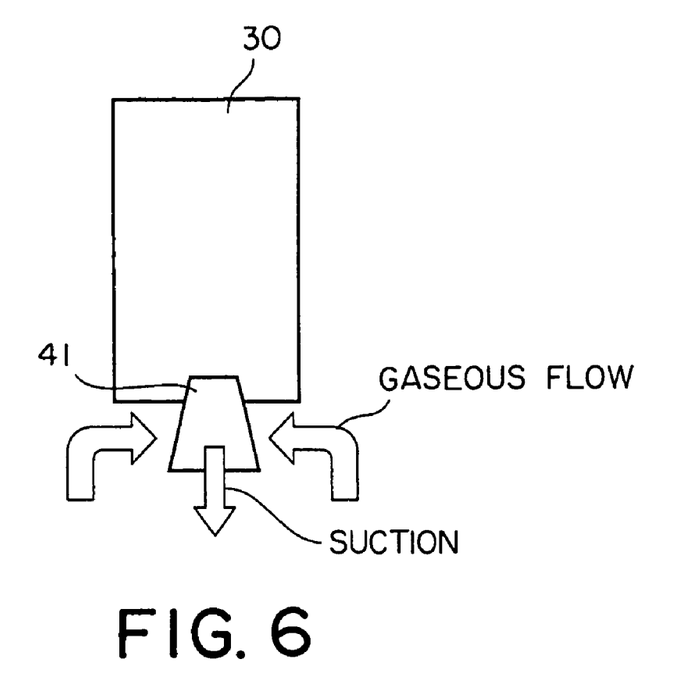
FIG. 6 is an elevation view for describing gaseous flows in a state illustrated in FIG. 5B.

As mentioned above, the gaseous flows flowing into the opening 46 of the base 43 is generated at the vicinity of the outer opening of the liquid crystal filling port 34. The liquid crystal 31 discharged from the panel assembly 30 through the liquid crystal filling port 34 is blown off by the gaseous flows and sucked into the opening 46 of the base 43. Simultaneously, the liquid crystal 31, which adheres to the edge of the panel assembly in the liquid crystal filling process, is also blown off and removed by the gaseous flows. Accordingly, a liquid crystal wiping off process is unnecessary after the liquid crystal filling process. This shortens a time from the end of the liquid crystal filling process to the beginning of the sealing process. Thus, the sealing process can be executed before the gap is partly expanded by the liquid crystal moved by gravitation. Furthermore, the gap can be adjusted with a high degree of accuracy.

According to the gap adjusting process, it is very easy to adjust the gap of the panel assembly in comparison with the third related method that the air displacement pump is airtightly coupled to the panel assembly by the use of the O ring. Concretely, when the panel assembly is housed in a cassette for the liquid crystal filling process, the gap adjusting process can be executed to it (i.e. the panel assembly housed in the cassette). In addition, the liquid crystal discharged from the panel assembly can almost completely be removed.

Figure 5C:
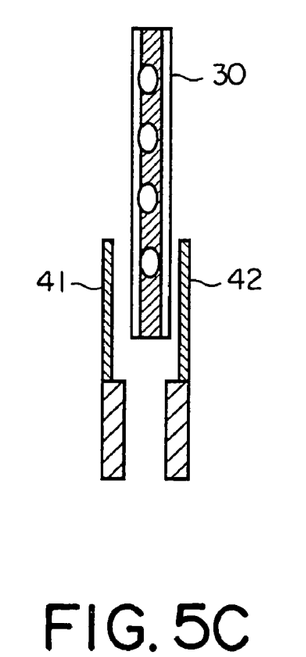

After that, when the evacuation is stopped, the nozzle plates 41 and 42 come apart from the surfaces of the panel assembly 30 by the resilience thereof as illustrated in FIG. 5C. Hereby the panel assembly 30 is freed from the nozzle plates 41 and 42 and can freely be moved.

Figure 7:
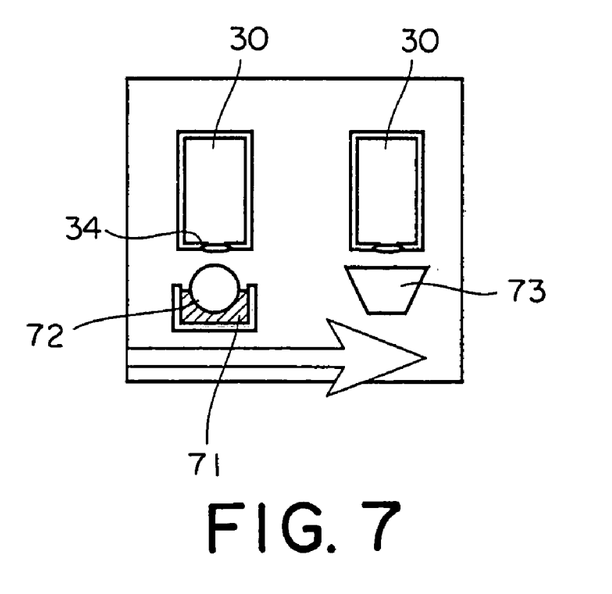
FIG. 7 is a schematic view for describing a sealing process of the method of manufacturing the liquid crystal panel according to the first embodiment of this invention.

Next, the sealing process is executed as illustrated in FIG. 7. That is, ultraviolet curing resin as sealant 71 is applied to the liquid crystal filling port 34 with a roller 72. Subsequently, ultraviolet rays are applied from an ultraviolet ray applying mechanism 73 to the ultraviolet curing resin applied to the liquid crystal filling port 34. Thus, the ultraviolet curing resin is hardened and the liquid crystal filling port 34 is sealed.

According to this embodiment, the gap adjusting process can be executed without changing posture of the panel assembly 30 on completion of the liquid crystal filling process. That is, the gap of the panel assembly 30 can be adjusted in a state that the liquid crystal filling port 34 is oriented downward. Therefore, the gap adjusting process can be executed for the panel assembly housed in the cassette used in the liquid crystal filling process.

Furthermore, according to this embodiment, there is no apprehension about damage given to the panel assembly 30 by pressing because the pressing plates are not necessary. In addition, the method of this embodiment is inexpensive and has no effect on global environment because it does not need the disposable spacer sheets.

Still furthermore, the method of this embodiment does not need the compressing chamber, and complicated mechanism and strength to correspond to the compressing chamber. In addition, because the method of this embodiment does not use the inert gas for the pressurizing, it is inexpensive and has no effect on global environment.

Next, the description will be made about a method of manufacturing a liquid crystal panel according to a second embodiment of this invention.

Figure 8:
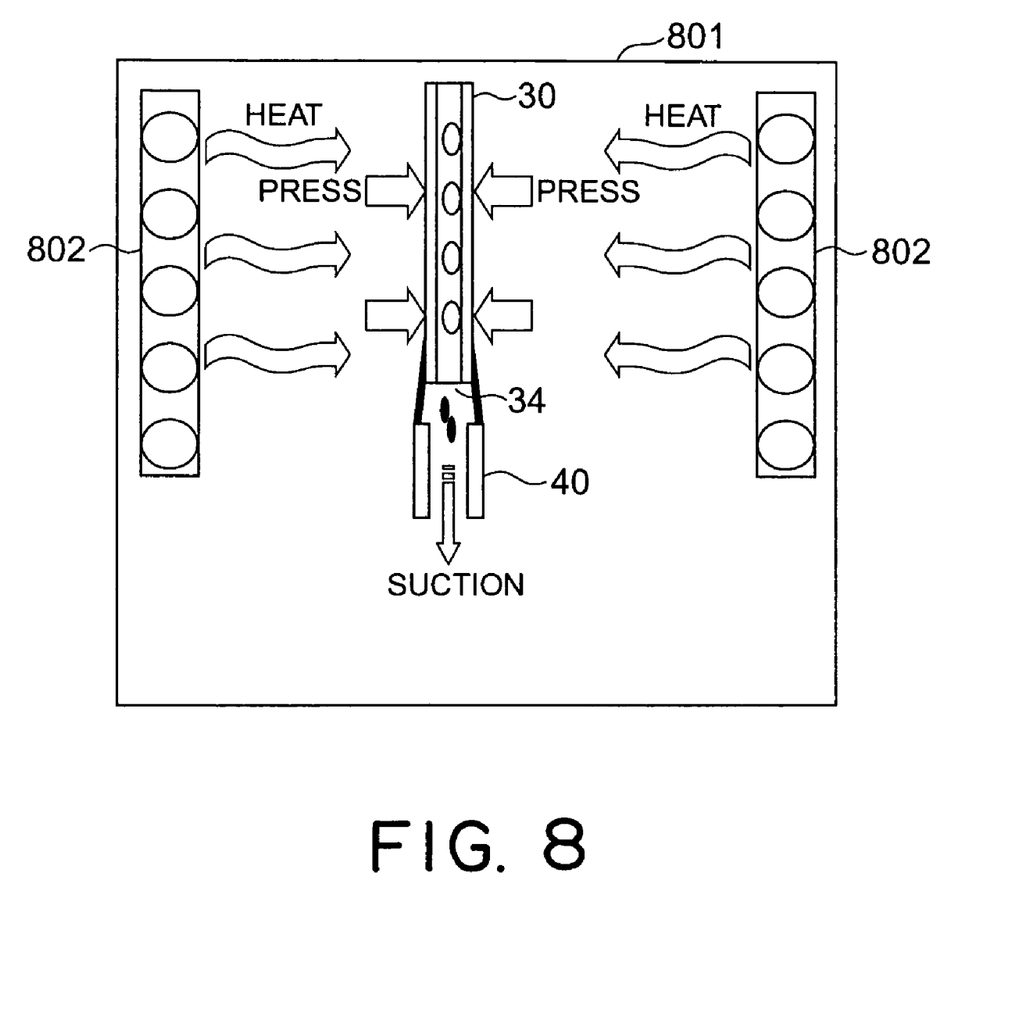
FIG. 8 is a schematic diagram for describing a gap adjusting process of a method of manufacturing a liquid crystal panel according to a second embodiment of this invention.

As illustrated in FIG. 8, a gap adjusting process of the method is executed in a compressing chamber 801. The compressing chamber 801 provides a heater(s) 802 therein to increase both faces of the panel assembly 30. FIG. 8 shows a state corresponding to that of FIG. 5B.

When the suction is executed by the use of the nozzle mechanism 40, pressurized gas is introduced into the compressing chamber 801 to increase the inner pressure thereof to a predetermined pressure value larger than atmospheric pressure and lower than 0.2 Mpa. The pressurized gas introduced in the compressing chamber 801 presses both faces of the panel assembly 30 to make discharge of the excess of the liquid crystal from the panel assembly easy.

Alternatively or additionally, the heater 802 heats the surfaces of the panel assembly 30 in a range of 30–100° C., preferably 40–90° C., further preferably 50–80° C. The increased surface temperature of the panel assembly 30 reduces viscosity of the liquid crystal and makes discharge of the excess of the liquid crystal from the panel assembly 30 easy.

According to this embodiment, the time for the gap adjusting process can be shorten and thereby productivity of the liquid crystal panel can be increased.

While this invention has thus far been described in conjunction with the preferred embodiments thereof, it will readily be possible for those skilled in the art to put this invention into practice in various other manners. For example, the gap adjusting apparatus is not limited to the nozzle mechanism 40 having the specific shape. The gap adjusting apparatus may have a cylindrical or polygonal intake as a substitute for the opening 46 formed in the base 43. The number of the gaseous flow control members and a shape of each gaseous flow control member may be decided according to a position of the liquid crystal filling port, a shape of the intake, sucking force of the intake and so on. When the sucking force of the intake is very strong, the gaseous flow control members may be unnecessary. In addition, each gaseous flow control member may be rigid. In such a case, two dividing plates can move close to/away from each other mechanically to hold/release the panel assembly.

Furthermore, the heater may heat the pressurized gas before the pressurized gas is introduced into the compressing chamber.

What is claimed is:

1. A method of manufacturing a liquid crystal panel including a panel assembly, comprising the steps of:
   filling a gap of the panel assembly with liquid crystal through a liquid crystal filling port of the panel assembly;
   placing an intake member in a vicinity of the liquid crystal filling port of the panel assembly with leaving a space between the intake member and the liquid crystal filling port;
   sucking through the intake member to generate negative pressure and a continuous gaseous flow around the liquid crystal filling port; and
   adjusting the gap by means of the negative pressure and the continuous gaseous flow.

2. A method as claimed in claim 1, further comprising the step of controlling the continuous gaseous flow by means of a gaseous flow control member.

3. A method as claimed in claim 2, wherein the gaseous flow control member partially comes close to the panel assembly according to the negative pressure.

4. A method as claimed in claim 3, wherein the gaseous flow control member is bent by the negative pressure.

5. A method as claimed in claim 2, wherein the gaseous flow control member limits the continuous gaseous flow in direction to increase velocity of the continuous gaseous flow.

6. A method as claimed in claim 5, wherein the continuous gaseous flow includes a flow along a longitudinal direction of an edge portion providing the liquid crystal filling port of the panel assembly.

7. A method as claimed in claim 1, further comprising the step of increasing temperature of the panel assembly.

8. A method as claimed in claim 7, further comprising the step of pressing the panel assembly from both faces thereof with pressurized gas.

9. A method as claimed in claim 1, further comprising the step of pressing the panel assembly from both faces thereof with pressurized gas.

10. A gap adjusting apparatus for use in manufacturing a liquid crystal panel including a panel assembly, comprising:
    an intake nozzle for sucking to produce negative pressure and continuous gaseous flow around a vicinity of an liquid crystal filling port of the panel assembly;
    a gaseous flow control member formed on said intake nozzle for controlling the continuous gaseous flow.

11. A gap adjusting apparatus as claimed in claim 10, wherein said gaseous flow control member limits the continuous gaseous flow in direction to increase velocity of the continuous gaseous flow.

12. A gap adjusting apparatus as claimed in claim 10, wherein said gaseous flow control member projects from a tip of said intake nozzle.

13. A gap adjusting apparatus as claimed in claim 12, wherein said gaseous flow control member comprises a pair of nozzle plates placed at both sides of an intake opening of said intake nozzle.

14. A gap adjusting apparatus as claimed in claim 13, wherein said nozzle plates partially come close to the panel assembly according to the negative pressure.

15. A gap adjusting apparatus as claimed in claim 14, wherein said nozzle plates are bent by the negative pressure.

16. A gap adjusting apparatus as claimed in claim 10, further comprising a heating means for increasing temperature of said panel assembly.

* * * * *